(12) United States Patent
Huang et al.

(10) Patent No.: US 9,478,641 B2
(45) Date of Patent: Oct. 25, 2016

(54) METHOD FOR FABRICATING FINFET WITH SEPARATED DOUBLE GATES ON BULK SILICON

(71) Applicant: PEKING UNIVERSITY, Beijing (CN)

(72) Inventors: Ru Huang, Beijing (CN); Jiewen Fan, Beijing (CN); Xiaoyan Xu, Beijing (CN); Jia Li, Beijing (CN); Runsheng Wang, Beijing (CN)

(73) Assignee: PEKING UNIVERSITY, Beijing (CN)

( * ) Notice: Subject to any disclaimer, the term of this patent is extended or adjusted under 35 U.S.C. 154(b) by 0 days.

(21) Appl. No.: 14/006,219

(22) PCT Filed: Oct. 11, 2012

(86) PCT No.: PCT/CN2012/082797
§ 371 (c)(1),
(2) Date: Mar. 25, 2015

(87) PCT Pub. No.: WO2014/032361
PCT Pub. Date: Mar. 6, 2014

(65) Prior Publication Data
US 2015/0236130 A1 Aug. 20, 2015

(30) Foreign Application Priority Data

Aug. 29, 2012 (CN) .......................... 2012 1 0313475

(51) Int. Cl.
*H01L 21/336* (2006.01)
*H01L 29/66* (2006.01)
(Continued)

(52) U.S. Cl.
CPC ..... *H01L 29/66795* (2013.01); *H01L 21/0217* (2013.01); *H01L 21/0277* (2013.01);
(Continued)

(58) Field of Classification Search
CPC ........... H01L 21/336; H01L 29/66795; H01L 29/0649; H01L 21/02164; H01L 21/0217; H01L 21/0277; H01L 21/31116
USPC ....................................................... 438/283
See application file for complete search history.

(56) References Cited

U.S. PATENT DOCUMENTS

| 5,886,380 A * | 3/1999 | Nakajima | .............. B82Y 10/00 |
| | | | 257/24 |
| 6,642,090 B1 | 11/2003 | Fried et al. | |

(Continued)

FOREIGN PATENT DOCUMENTS

| CN | 1622301 | 6/2005 |
| CN | 1653608 | 8/2005 |

(Continued)

OTHER PUBLICATIONS

"A Simple Nano-Scale Patterning Technology for FinFET Fabrication" by Xu Han, Chengen Yang, Dingyu Li, and Shengdong Zhang; Key Laboratory of Microelectronic Devices and Circuits, Institute of Microelectronics, Peking University, Beijing 100871, P.R. China.

(Continued)

*Primary Examiner* — Phuc Dang
(74) *Attorney, Agent, or Firm* — Dickinson Wright PLLC

(57) ABSTRACT

Disclosed herein is a method for fabricating a FinFET with separated double gates on a bulk silicon, comprising: forming a pattern for a source, a drain and a thin bar connecting the source and the drain; forming an oxidation isolation layer; forming a gate structure and a source/drain structure; and forming a metal contact and a metal interconnection. By means of the method herein, it is very easy to fabricate the FinFET with separated double gates on the bulk silicon wafer, and the overall process flow is completely compatible with the conventional silicon-based very large scale integrated circuit manufacturing technology. Thus, the method herein is simple, convenient and has a short process period, greatly economizing the cost of the silicon wafer. In addition, by employing the FinFET with separated double gates fabricated by the method according to the invention, the short channel effect can be effectively suppressed. Further, the power consumption of the device can be further reduced through the special multi-threshold characteristic of the device with separated double gates.

4 Claims, 4 Drawing Sheets

(51) Int. Cl.
*H01L 21/02* (2006.01)
*H01L 21/027* (2006.01)
*H01L 21/311* (2006.01)
*H01L 21/306* (2006.01)
*H01L 21/28* (2006.01)
*H01L 21/321* (2006.01)
*H01L 21/3213* (2006.01)
*H01L 21/265* (2006.01)
*H01L 21/324* (2006.01)
*H01L 29/06* (2006.01)

(52) U.S. Cl.
CPC ... *H01L21/02164* (2013.01); *H01L 21/02238* (2013.01); *H01L 21/26513* (2013.01); *H01L 21/28035* (2013.01); *H01L 21/30604* (2013.01); *H01L 21/31116* (2013.01); *H01L 21/324* (2013.01); *H01L 21/3212* (2013.01); *H01L 21/32133* (2013.01); *H01L 29/0649* (2013.01); *H01L 21/02255* (2013.01)

(56) References Cited

U.S. PATENT DOCUMENTS

| | | | |
|---|---|---|---|
| 6,787,402 B1 | 9/2004 | Yu | |
| 6,853,020 B1 | 2/2005 | Yu et al. | |
| 2004/0150029 A1 | 8/2004 | Lee | |
| 2004/0235255 A1* | 11/2004 | Tanaka | H01L 21/26586 438/302 |
| 2005/0260808 A1* | 11/2005 | Chen | H01L 29/6653 438/197 |
| 2005/0260818 A1* | 11/2005 | Fujiwara | H01L 29/4908 438/300 |
| 2007/0296048 A1 | 12/2007 | Ban et al. | |
| 2008/0303096 A1* | 12/2008 | Schulz | H01L 29/66795 257/365 |
| 2009/0008705 A1* | 1/2009 | Zhu | H01L 29/66795 257/327 |
| 2012/0181591 A1* | 7/2012 | Chen | H01L 27/11519 257/314 |
| 2013/0009231 A1* | 1/2013 | Xia | H01L 27/11534 257/316 |

FOREIGN PATENT DOCUMENTS

| | | |
|---|---|---|
| CN | 101267001 A | 9/2008 |
| CN | 102272905 A | 12/2011 |
| CN | 102832133 | 12/2012 |
| JP | 2011168310 A | 9/2011 |
| KR | 20060113500 A | 11/2006 |

OTHER PUBLICATIONS

The Research Suitable for Double-Gate/ Multi-Gate Devices with Nanometer Scale Integrated Circuit Techniques.
International Search Report for PCT/CN2012/082797, dated Jun. 6, 2013.

* cited by examiner

METHOD FOR FABRICATING FINFET WITH SEPARATED DOUBLE GATES ON BULK SILICON

FIELD OF THE INVENTION

The invention relates to a method for fabricating a field effect transistor by using wet etching, which belongs to a technical field of manufacture of very-large-scale integrated circuits.

BACKGROUND OF THE INVENTION

Nowadays, the semiconductor manufacturing industry has been developing under the guidance of Moore's law, the performance and the integrated density of integrated circuits being continually enhanced while the power consumption of the integrated circuits being reduced as much as possible. Accordingly, the fabrication of an ultra short channel device with high performance and low power consumption would become the focus in the future semiconductor manufacturing industry. After a 22-nanometer technology node comes, a leakage current of conventional planar field effect transistor has been continuously increasing and the short channel effect and the drain induced barrier lowering (DIBL) effect are becoming increasingly serious, which can not appropriately adapt to the development of the semiconductor manufacturing. In order to overcome a series of the above-mentioned problems, a mass of new-structured semiconductor device, such as Double Gate FET, FinFET, Tri-Gate FET, Gate-all-around (GAA) Nanowire (NW) FET and so forth are emerging and gradually drawing wide attention. By means of a multi-gate structure, the gate control ability to a channel can be desiredly enhanced so that electric field lines have difficulties in directly passing through the channel from a drain to a source. Thus, the drain induced barrier lowering effect can be dramatically ameliorated, the leakage current can be reduced, and the short channel effect can be substantially inhibited. Owing to the face that the multi-gate structure has resulted in an good gate control ability, unlike in the conventional planar field effect transistor, it is not necessary for the channel region to be heavily doped to suppress the short channel effect. Since a lightly-doped channel area has advantages in reducing the drop of the mobility due to the scattering, the mobility of the multi-gate structured device can be greatly improved. Therefore, the FinFET, as a new-structured device, would be capable of becoming a promising alternative to the conventional planar field effect transistor.

A concept of "folded-channel MOSFETs" was proposed in the IEDM conference in 1998 by Hasimoto et al. And in 1999, a FinFET with a channel length below 50 nm was disclosed in the IEDM conference. That was the first time to successfully integrate the FinFET on a substrate by using a conventional silicon process.

A structure of the FinFET and a process for fabricating the same were disclosed in U.S. Pat. No. 6,413,802 by Hu et al. The FinFET can be formed on a SOI substrate most easily, the process being relatively simple, where the FinFET can be formed just by photoetching a top silicon layer on the SOI substrate to form a pattern of a Fin bar and then performing a series of processings such as a gate processing, a source/drain processing and a back-ended interconnection of a dielectric layer and a metal. However, it has disadvantages as follows: (1) a process cost is too high due to the quite expensive SOI substrate; (2) it is necessary to perform a source/drain lifting technology, or else a spreading resistance of the source/drain would be too high, resulting in an excessively small on-current and thus poorer device performance; (3) due to the absence of a body leading-out, a threshold voltage cannot be adjusted by means of a substrate bias effect. Meanwhile, in the case that the FinFET is formed on a bulk silicon substrate, the issue is avoided that the source/drain spreading resistance is too high, and moreover, a voltage can also be applied to a body terminal to obtain the substrate bias effect so that the threshold voltage may be adjusted more easily to a more appropriate value. Nevertheless, it also has its own disadvantages as follows: (1) the process is relatively complicated and the requirement for control of the process is even higher, since it is necessary to add an oxidation isolation layer to the FinFET so as to suppress a turning-on of a bottom planar transistor and reduce the leakage current; (2) although the oxidation isolation layer is added, due to the presence of a further current path from the source to the drain in addition to the Fin bar, the gate control ability is not as excellent as that of the device fabricated on the SOI substrate, resulting in that the power consumption due to the leakage current in the ultra short channel device remains larger.

SUMMARY OF THE INVENTION

An object of the invention is directed to provide a method for fabricating a FinFET with separated double gates on a bulk silicon, which is compatible with a conventional silicon-based very large scale integrated circuit manufacturing technology.

The invention is accomplished by the following technical solution: a method for fabricating a FinFET with separated double gates on a bulk silicon is provided, including the steps of:

a) defining a pattern for a source, a drain and a thin bar connecting the source and the drain The step is aimed primarily at forming the pattern for a source, a drain and the thin bar connecting the source and the drain on a hard mask through an electron beam photolithography process, by means of which the resultant thin bar is enabled to have a width of approximately 20-40 nanometers.

i. depositing a silicon oxide layer and a silicon nitride layer on a silicon substrate as a hard mask;

ii. forming the pattern for a source, a drain and the thin bar connecting source and the drain on the hard mask, through performing an electron beam photolithography process one time and performing an etching process on the silicon nitride layer and the silicon oxide layer;

iii. removing an electron beam resist;

iv. performing an etching process on the silicon substrate, so as to transfer the pattern on the hard mask onto the silicon substrate;

b) forming an oxidation isolation layer

The step is aimed primarily at forming an oxidation layer under a Fin bar and on a surface of the substrate on both sides with respect to the Fin bar, so that this oxidation isolation layer can serve to inhibit a planar transistor in the substrate from turning on to prevent a current from flowing through the substrate from the source to the drain. Thus, the leakage current can be lowered and the power consumption can be reduced.

i. depositing a further silicon nitride layer;

ii. etching the further silicon nitride layer by using an anisotropic dry etching process, so as to form a silicon nitride sidewall on both sides of a Fin bar;

iii. etching the silicon substrate exposed on both sides with respect to the Fin bar by using anisotropic dry etching process;

iv. forming the oxidation isolation layer under the Fin bar and on a surface of the substrate on both sides with respect to the Fin bar by using a wet oxidation process;

c) forming a gate structure and a source/drain structure

The step is aimed primarily at forming the gate structure, where the gate structure need be defined by an electron beam photolithography process, mainly because the electron beam photolithography process can readily control a width of a gate to approximately 22 nanometers, which is a desired channel length. In addition, a chemical mechanical polishing (CMP) process is performed so that the gate structures on both sides with respect to the Fin bar are divided and separated from each other.

i. removing the silicon nitride sidewall and the silicon nitride layer of the hard mask by using a wet etching process;

ii. growing a gate oxide thin layer by using a thermal oxidation process;

iii. depositing a polysilicon layer as a gate material;

iv. performing a chemical mechanical polishing (CMP) process to planarize the polysilicon layer, the process stopping at a surface of the silicon oxide layer of the hard mask on top of the Fin bar;

v. forming polysilicon gate lines through performing an electron beam photolithography process and etching the polysilicon gate material, so that the gate lines on both sides with respect to the Fin bar are not coupled together and are separated from each other;

vi. forming silicon oxide sidewalls by using an ion enhanced chemical vapor deposition process and an etchback process;

vii. performing an ion implantation process and a high temperature annealing process so as to form the source/drain structure.

d) forming a metal contact and a metal interconnection

The step is aimed primarily at making a leading-out for the source/drain and the gate, so as to facilitate a testing and a formation of a large-scale circuit structure.

The invention has technical advantages as followings.

First of all, the cost of the silicon wafer is greatly economized owing to fabricating a device on a bulk silicon substrate; secondly, the difficulties that the process for on the bulk silicon substrate fabricating a FinFET is complicated and the requirement for control of the process is high can be overcome through the simple and new method herein, and the overall process flow is completely compatible with the conventional silicon-based very large scale integrated circuit manufacturing technology; and lastly, by virtue of the FinFET with separated double gates fabricated by the method herein, the short channel effect can be effectively suppressed, and the power consumption of the device can be further reduced through the special multi-threshold characteristic of the device with separated double gates, which is mainly because of two reasons: one, the oxidation layer formed under the Fin bar and on the surface of the substrate on both sides with respect to the Fin bar has an isolation effect, so that the parasitic planar transistor in the substrate can be inhibited from turning on to prevent current from flowing through the substrate from the source to the drain; and the other, the threshold can be adjusted easily through the structure of separated double gates, and thereby the multi-threshold device is capable of having further reduced the power consumption while maintaining the high performance.

BRIEF DESCRIPTION OF THE DRAWINGS

FIG. 1 is a diagram showing a structure after depositing a silicon oxide thin layer and a silicon nitride thin layer as a hard mask;

FIG. 2 is a diagram showing a structure after forming a pattern of a Fin bar by using an electron beam photolithography process and then transferring the pattern to a silicon substrate by using an anisotropic dry etching process;

FIG. 3 is a diagram showing a structure after forming a silicon nitride sidewall by depositing a silicon nitride layer and then etching the silicon nitride layer;

FIG. 4 is a diagram showing a structure after etching the silicon substrate by using an anisotropic dry etching process to expose the silicon substrate under the Fin bar for performing a subsequent oxidation process;

FIG. 5 is a diagram showing a structure after forming an oxidation isolation layer under the Fin bar by using the oxidation process;

FIG. 6 is a cross-sectional diagram taken along an AA direction in the structure of FIG. 5;

FIG. 7 is a diagram showing a structure after removing the silicon nitride layer;

FIG. 8 is a cross-sectional diagram taken along an AA direction in the structure of FIG. 7;

FIG. 9 is a diagram showing a structure after depositing a gate oxidation layer and then a gate material layer and then performing a subsequent CMP process;

FIG. 10 is a diagram showing a structure after forming a pattern of gate lines by using an electron beam photolithography process and then transferring the pattern by using an anisotropic dry etching process;

FIG. 11 is a cross-sectional diagram taken along an AA direction in the structure of FIG. 10; and FIG. 12 is a diagram showing an final structure after performing a sidewall process, an implantation process for a source/drain and an annealing process.

Figure 1:
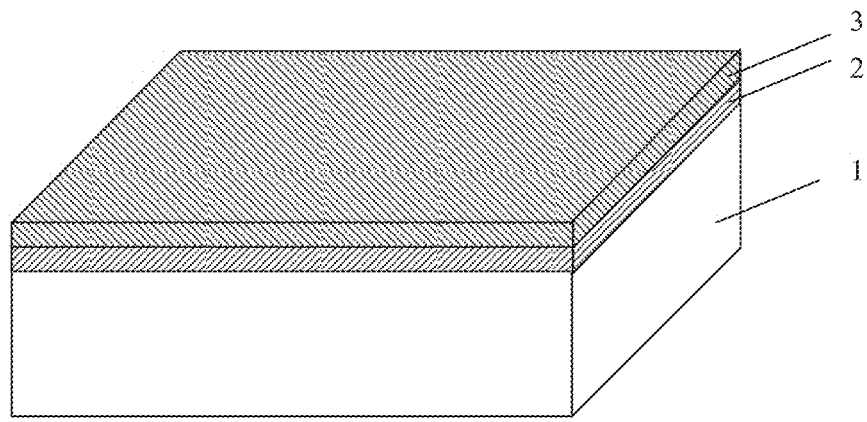
FIGS. 1-12 are schematic diagrams showing a process flow of a method for fabricating a FinFET with separated double gates on a bulk silicon according to the invention. The process flow is described briefly by the following.

In the drawings: 1—a silicon; 2—a silicon oxide layer; 3—a silicon nitride layer; 4—a polysilicon layer

DETAILED DESCRIPTION OF THE EMBODIMENTS

Hereinafter, the invention is described in more details with reference to the accompany drawings along with embodiments. A specific scheme for accomplishing the process of fabricating a FinFET with separated double gates on a bulk silicon according to the invention is given. However, the scope of the invention is not limited thereto by any means.

Figure 2:
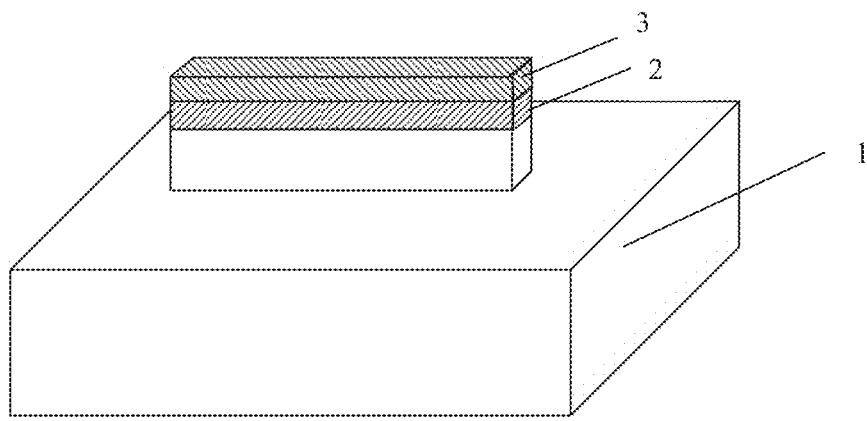
Figure 3:
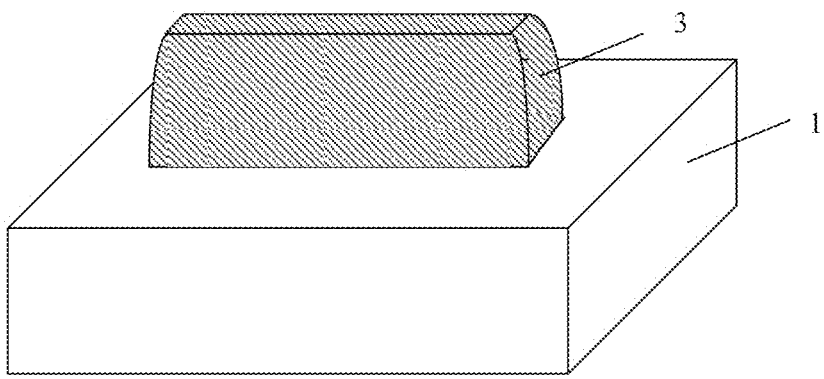
Figure 4:
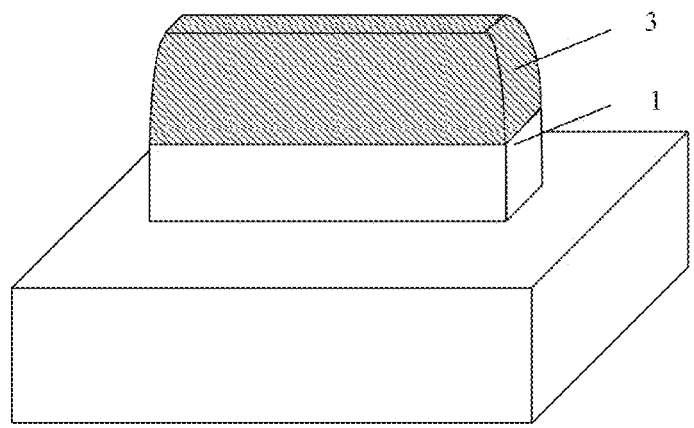
Figure 5:
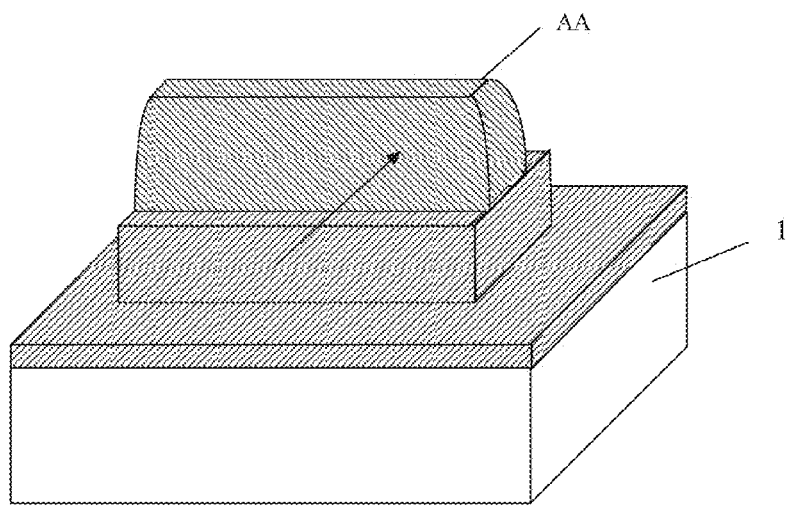
Figure 6:
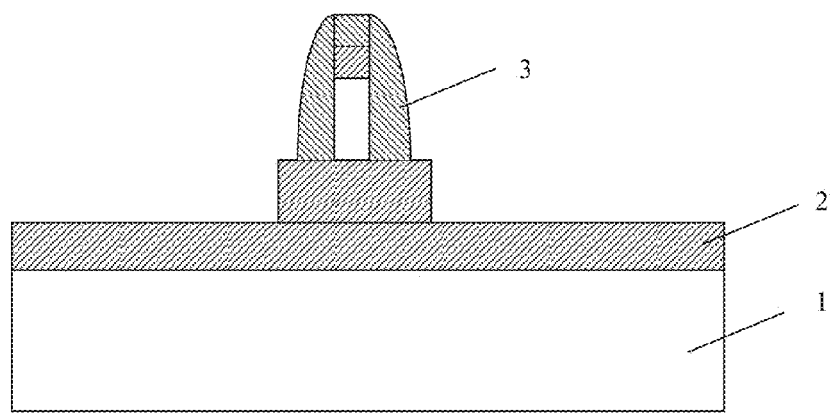
Figure 7:
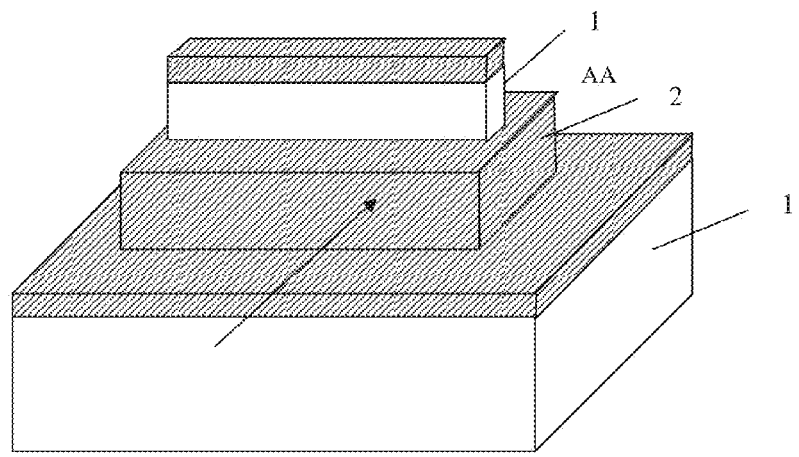
Figure 8:
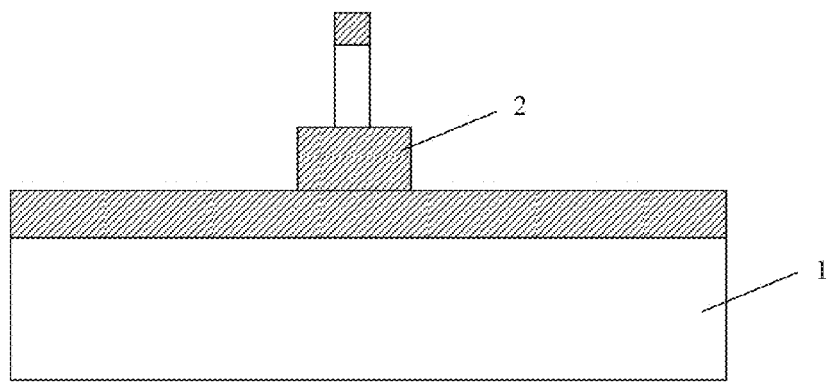
Figure 9:
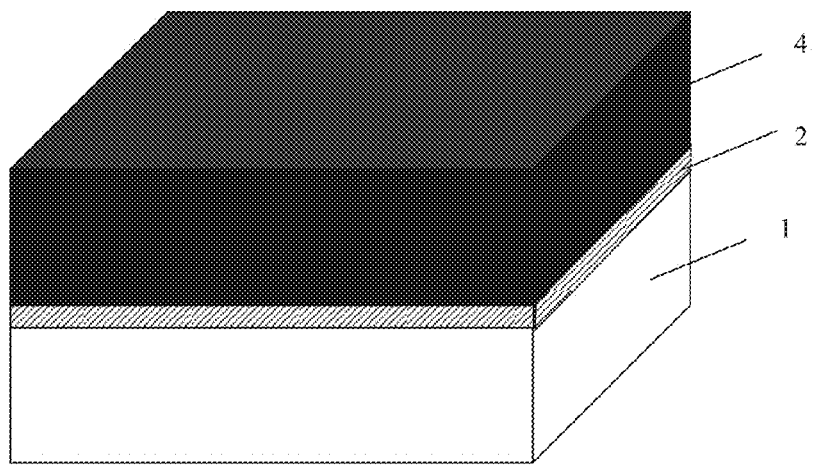
Figure 10:
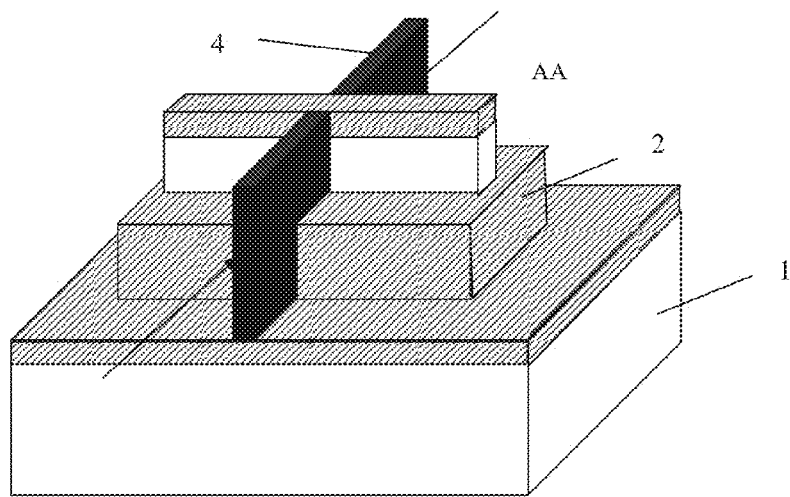
Figure 11:
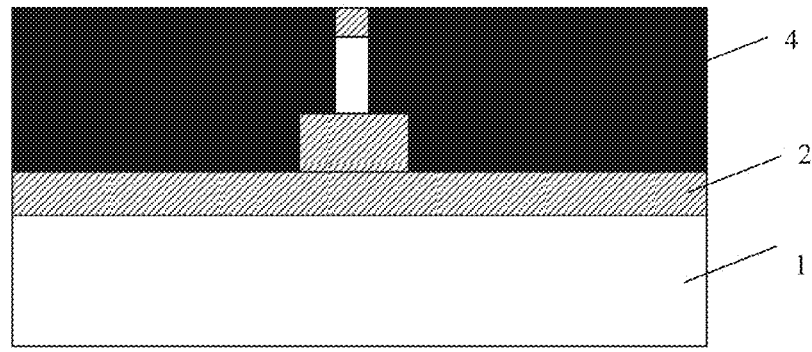
Figure 12:
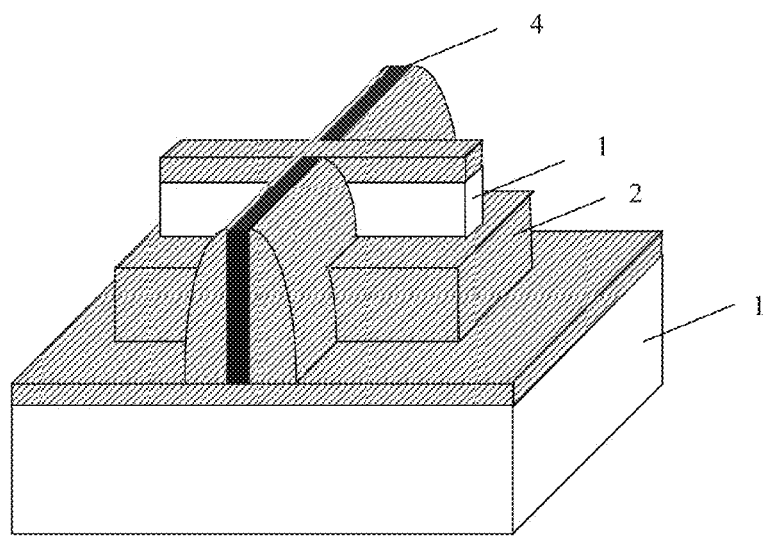

An n-type FinFET with separated double gates, which has a Fin bar with a width of about 20 nanometers and a channel length of about 32 nanometers, is fabricated through the following steps of:

1. depositing a silicon oxide layer with a thickness of 300 Å on a silicon substrate by using a low pressure chemical vapor deposition process;

2. depositing a silicon nitride layer with a thickness of 1000 Å on the silicon oxide layer by using a low pressure chemical vapor deposition process, and as shown in FIG. 1, the deposited silicon oxide layer and silicon nitride layer being used as a hard mask;

3. defining a Fin bar by using an optical lithography process so as to be ready to form a pattern for a source, a drain, and a thin bar connecting the source and the drain on the hard mask;

4. etching the silicon nitride layer by a depth of 1000 Å through an anisotropic dry etching process;

5. etching the silicon oxide layer by a depth of 300 Å through an anisotropic dry etching process;

6. etching the silicon substrate by a depth of 1000 Å through an anisotropic dry etching process, as shown in FIG. 2, so as to transfer the pattern on the hard mask onto the silicon substrate;

7. depositing a silicon nitride layer with a thickness of 500 Å on the silicon substrate by using a low pressure chemical vapor deposition process;

8. etching the silicon nitride layer by a depth of 500 Å through an anisotropic dry etching process, so as to form a sidewall, as shown in FIG. 3;

9. etching the silicon substrate by a depth of 1000 Å through an anisotropic dry etching process, so as to expose the silicon material of the substrate under the Fin bar, as shown in FIG. 4;

10. forming an oxidation isolation layer under the Fin bar and on a surface of the substrate on both sides with respect to the Fin bar by wet oxidating silicon by a depth of 300 Å, as shown in FIG. 5;

11. etching the silicon nitride layer by a depth of 1000 Å through an isotropy wet etching process, as shown in FIG. 7;

12. growing a silicon oxide layer with a thickness of 15 Å as a gate oxide layer through a thermal oxidation process;

13. depositing a polysilicon layer with a thickness of 3000 Å as a gate material through a low pressure chemical vapor deposition process;

14. planarizing the polysilicon layer through a chemical mechanical polishing (CMP) process, the process stopping at the silicon oxide layer of the hard mask, as shown in FIG. 9;

15. defining gate thin lines each with a width of 32 nanometers by using an electron beam photolithography process;

16. etching the polysilicon layer by a depth of 3000 Å through an anisotropy dry etching process so as to form the gate thin lines, as shown in FIG. 10, so that the gate thin lines on both sides with respect to the Fin bar are not coupled together and are separated from each other;

17. depositing a silicon oxide layer with a thickness of 200 Å through a low pressure chemical vapor deposition process, serving as a sidewall material;

18. etching the silicon oxide layer by a depth of 200 Å through an anisotropy dry etching process so as to form sidewalls;

19. performing an ion implantation of As ion for source/drain with an implanting energy of 50 keV and an implanting dosage of 4e15 cm-2;

20. performing a RTP annealing at 1050 degree Celsius for 5 seconds under an atmosphere of nitrogen, as shown in FIG. 12, so as to form the source/drain structure;

21. forming a metal contact and a metal interconnection and leading out the source/drain and the gate and thus forming a large-scale circuit structure.

It should be noted that, the specific embodiments have been described for the purpose that the invention is further understood. However, those skilled in the art should be appreciated that, any substitutions and modifications are possible without departing from the invention within the spirit and the scope of the appended claims. Therefore, the invention should not be limited to the content disclosed herein by the embodiments. The scope that the invention intends to seek is defined by the claims.

What is claimed is:

1. A method for fabricating a FinFET with separated double gates on a bulk silicon, comprising:
   a) forming a pattern for a source, a drain, and a thin bar connecting the source and the drain
   i. depositing a silicon oxide layer and a silicon nitride layer on a silicon substrate as a hard mask;
   ii. forming the pattern for a source, a drain and the thin bar connecting the source and the drain in the hard mask through performing an electron beam photolithography process one time and performing an etching process on the silicon nitride layer and the silicon oxide layer;
   iii. removing an electron beam resist;
   iv. performing an etching process on the silicon substrate, so as to transfer the pattern on the hard mask onto the silicon substrate;
   b) forming an oxidation isolation layer
   i. depositing a further silicon nitride layer;
   ii. etching the further silicon nitride layer by using an anisotropic dry etching process, so as to form a silicon nitride sidewall on both sides of a Fin bar;
   iii. etching the silicon substrate exposed on both sides with respect to the Fin bar by using anisotropic dry etching process;
   iv. forming the oxidation isolation layer on a surface of the substrate which is positioned under the Fin bar and at both sides of the Fin bar by wet oxidizing the surface of the silicon substrate which has been etched by using anisotropic dry etching process;
   c) forming a gate structure and a source/drain structure
   i. removing the silicon nitride sidewall and the silicon nitride layer of the hard mask by using a wet etching process;
   ii. growing a gate oxide layer by using a thermal oxidation process;
   iii. depositing a polysilicon layer as a gate material;
   iv. performing a chemical mechanical polishing (CMP) process to planarize the polysilicon layer, the process stopping at a surface of the silicon oxide layer of the hard mask on top of the Fin bar;
   v. forming polysilicon gate lines by performing an electron beam photolithography process and etching the polysilicon gate material, so that the gate lines on both sides with respect to the Fin bar are not coupled together and are separated from each other;
   vi. forming silicon oxide sidewalls by using an ion enhanced chemical vapor deposition process and an etch-back process;
   vii. performing an ion implantation process and a high temperature annealing process so as to form the source/drain structure,
   wherein: in step b), a connection between the Fin bar and the substrate is completely or partially isolated by the grown oxidation isolation layer.

2. The method for fabricating the FinFET with separated double gates on the bulk silicon of claim 1, wherein: in step c), the thermal-oxidized gate dielectric layer and the polysilicon gate material are a high-k gate dielectric layer and a metal gate material, respectively.

3. The method for fabricating the FinFET having separated double gates on the bulk silicon of claim 1, wherein: in steps a) and c), the pattern for a source, a drain, and a thin bar connecting the source and the drain is formed through an electron beam photolithography process.

4. The method for fabricating the FinFET with separated double gates on the bulk silicon of claim 1, wherein: in step b), the oxidation isolation layer is grown by a process of wet oxidation thermal growth of silicon oxide.

* * * * *